(12) United States Patent
Yang

(10) Patent No.: US 10,319,449 B1
(45) Date of Patent: Jun. 11, 2019

(54) MEMORY DEVICE AND OPERATION METHOD THEREOF

(71) Applicant: MACRONIX INTERNATIONAL CO., LTD., Hsinchu (TW)

(72) Inventor: Shang-Chi Yang, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/838,472

(22) Filed: Dec. 12, 2017

(51) Int. Cl.
| | | |
|---|---|---|
| G11C 16/30 | (2006.01) |
| G05F 3/24 | (2006.01) |
| G05F 3/26 | (2006.01) |
| G11C 16/24 | (2006.01) |
| G11C 16/34 | (2006.01) |
| G11C 5/14 | (2006.01) |

(52) U.S. Cl.
CPC ............... *G11C 16/30* (2013.01); *G05F 3/247* (2013.01); *G05F 3/26* (2013.01); *G11C 5/147* (2013.01); *G11C 16/24* (2013.01); *G11C 16/34* (2013.01)

(58) Field of Classification Search
CPC ......... G11C 16/30; G11C 5/147; G11C 16/24; G11C 16/34; G05F 3/247; G05F 3/26
USPC ...................................... 365/185.18
See application file for complete search history.

(56) References Cited

U.S. PATENT DOCUMENTS

| | | | |
|---|---|---|---|
| 7,577,031 B2 | 8/2009 | Sekar et al. |
| 7,656,713 B2 | 2/2010 | Cernea |
| 8,953,384 B2 | 2/2015 | Chan et al. |
| 9,257,194 B1 | 2/2016 | Huang |
| 9,625,934 B2 | 4/2017 | Ryabchenkov et al. |
| 2008/0247241 A1* | 10/2008 | Nguyen ............. G11C 11/5621 365/185.22 |

\* cited by examiner

*Primary Examiner* — Fernando Hidalgo
(74) *Attorney, Agent, or Firm* — McClure, Qualey & Rodack, LLP

(57) ABSTRACT

A memory device is provided. The memory device includes: a memory array having a plurality of cells; a regulator, coupled to the memory, the regulator being configured to provide a bit line voltage to a selected cell of the memory array and to provide a bias voltage; and a controllable current source, coupled to the memory array, the controllable current source being configured to conduct a controllable current in the controllable current source until a cell current of the selected cell reaches a threshold.

8 Claims, 3 Drawing Sheets

US 10,319,449 B1

MEMORY DEVICE AND OPERATION METHOD THEREOF

TECHNICAL FIELD

The disclosure relates in general to a memory device and an operation method thereof.

BACKGROUND

Flash memory devices have developed into a popular source of non-volatile memory for a wide range of electronic applications. Common uses for flash memory include personal computers, personal digital assistants, digital cameras, and cellular telephones.

Read is required in various operations such as erase verify, program verify. During read operation, drain read disturb may be occurred if the drain side voltage is too high. Drain read disturb is an intrinsic reliability concern. Read operation is typically executed at low operation voltage, such as 1V. The cell disturb induced by low drain bias is expected to be small. As flash cell continues to scale down and the read window continues to narrow, drain read window is becoming a critical element for the memory array design.

Thus, setting an appropriate drain voltage is essential to sustain the product functionality and reliability. The application provide a memory device and an operation method thereof to improve drain read disturb.

SUMMARY

According to one embodiment, a memory device is provided. The memory device includes: a memory array having a plurality of cells; a regulator, coupled to the memory, the regulator being configured to provide a bit line voltage to a selected cell of the memory array and to provide a bias voltage; and a controllable current source, coupled to the memory array, the controllable current source being configured to conduct a controllable current in the controllable current source until a cell current of the selected cell reaches a threshold.

According to another embodiment, an operation method for a memory device is provided. The operation method includes: providing a bit line voltage to a selected cell of the memory device; conducting a controllable current in the memory device to maintain the bit line voltage and shutting down the controllable current when a cell current of the selected cell reaches a threshold.

Figure 1:
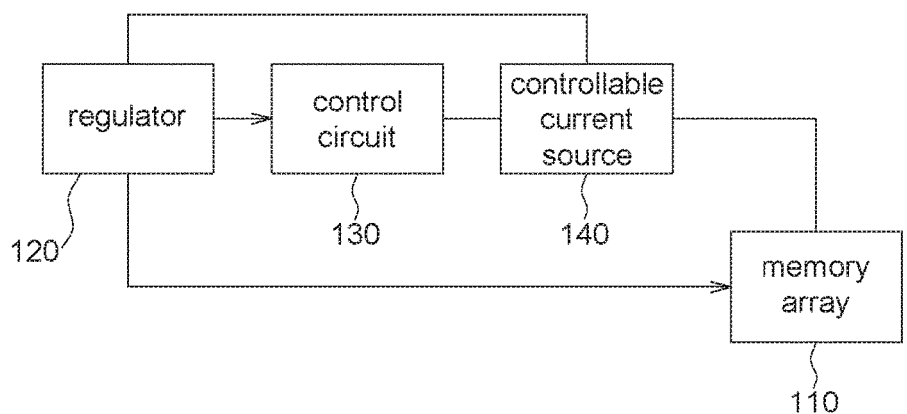
FIG. 1 shows a functional block diagram for a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. However, it does not mean that implementation of the disclosure needs every technical feature of any embodiment of the disclosure or combination of the embodiments of the disclosure is prohibited. In other words, in possible implementation, one skilled person in the art would selectively implement part or all technical features of any embodiment of the disclosure or selectively combine part or all technical features of the embodiments of the disclosure.

FIG. 1 shows a functional block diagram for a memory device according to one embodiment of the application. The memory device 100 according to one embodiment of the application includes a memory array 110, a regulator 120, a control circuit 30 and a controllable current source 140.

The memory array 110 is coupled to the regulator 120 and the controllable current source 140. The memory array 110 may be a reference cell array having a plurality of reference cells and/or a data cell array having a plurality of data cells. Also, the memory array 110 includes a plurality of word lines and a plurality of bit lines. The cells are on the intersections of the word lines and the bit lines.

The regulator 120 is configured for regulating a voltage applied cross a load so as to make the applied voltage insensitive against changes in the current drawn by the load. An ideal voltage regulator delivers a voltage that does not depend on the resistance of the load. The regulator 120 is coupled to the control circuit 130 and the memory array 110. The regulator 120 is configured to provide a drain side voltage (i.e. a bit line voltage) to a selected cell of the memory array 110. Also, the regulator 120 is configured to provide a bias voltage to the control circuit 130.

The control circuit 130 is coupled to the regulator 120 and the controllable current source 140 for controlling the controllable current source 140. Also, the control circuit 130 may maintain the drain side voltage of the selected cell of the memory array 110.

The controllable current source 140 is coupled to the memory array 110 and the control circuit 130. The controllable current source 140 is used to conduct a controllable current in the controllable current source 140 until a cell current of the selected cell reaches a threshold. Also, the control circuit 130 and the controllable current source 140 are configured to maintain the bit line voltage of the selected cell of the memory array via conduction of the controllable current in the controllable current source.

Figure 2:
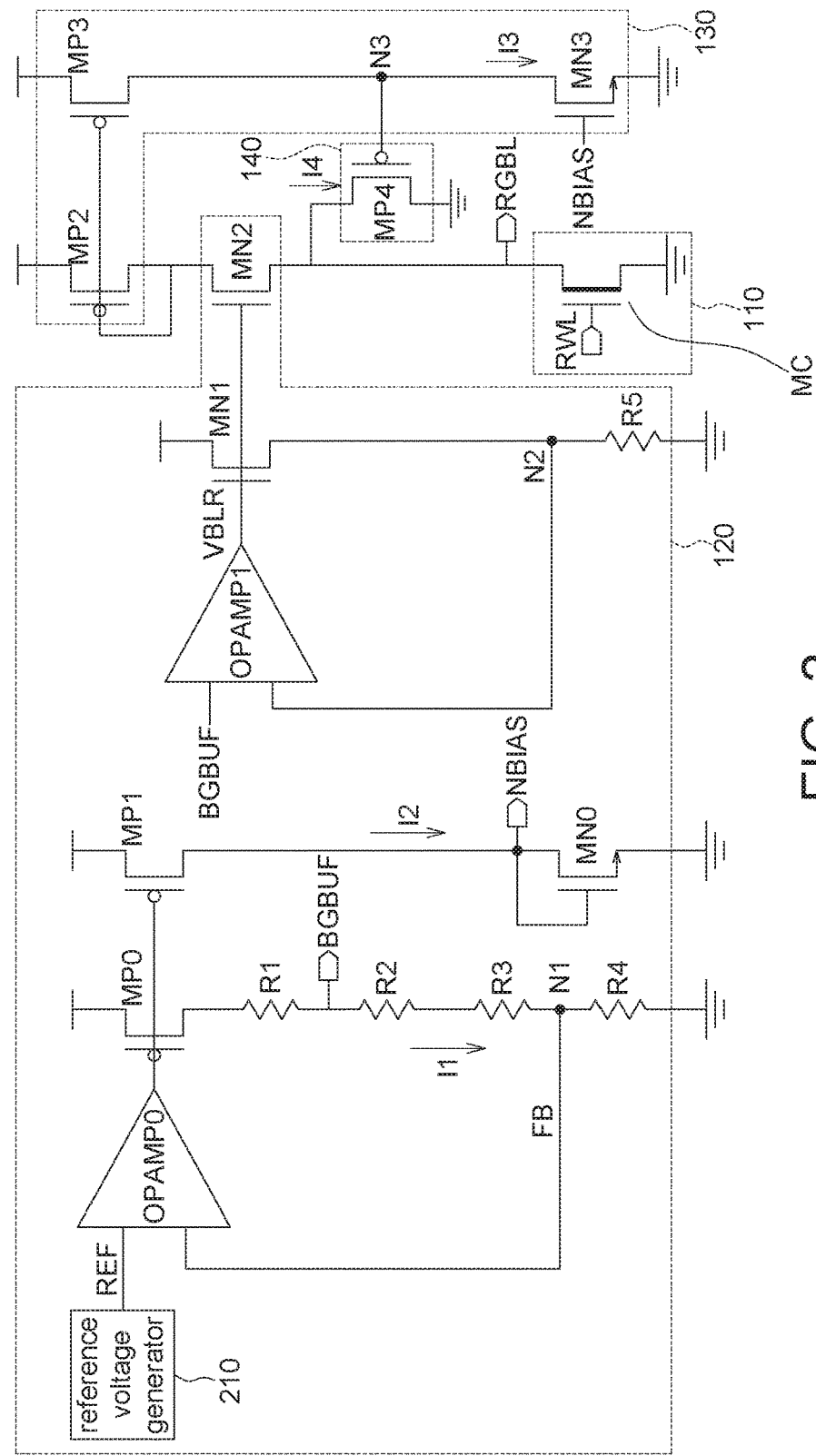
FIG. 2 shows a circuit diagram for a memory device according to one embodiment of the application.

FIG. 2 shows a circuit diagram for a memory device according to one embodiment of the application. FIG. 2 shows one cell MC in the memory array 110 and the number of the cells is for description purpose only, not for limiting the invention. The regulator 120 of the memory device 100 includes a reference voltage generator 210, operation amplifiers OPAMP0 and OPAMP1, PMOS transistors MP0, MP1, NMOS transistors MN0, MN1, MN2, and resistors R1, R2, R3, R4 and R5. The control circuit 130 of the memory device 100 includes PMOS transistors MP2 and MP3 and a NMOS transistor MN3. The controllable current source 140 of the memory device 100 includes a PMOS transistor MP4.

In the regulator 120 of the memory device 100, the reference voltage generator 210, for example but not limited by, a bandgap circuit, may generate a reference voltage REF which is resistive to process, voltage and temperature variations. The reference voltage generator 210 provides the reference voltage REF (for example but not limited by 1V), to the operation amplifier OPAMP0.

The operation amplifier OPAMP0 receives the reference voltage REF from the reference voltage generator 210. Further, the input terminal of the operation amplifier OPAMP0 is coupled to the node N1 between the resistors R3 and R4. The operation amplifier OPAMP0 has an output terminal coupled to the gates of the PMOS transistors MP0 and MP1.

The operation amplifier OPAMP1 receives a bias voltage BGBUF. Further, the input terminal of the operation amplifier OPAMP1 is coupled to the node N2 between the resistor R5 and the NMOS transistor MN1. The operation amplifier OPAMP1 has an output terminal for providing a bias voltage VBLR to the gates of the NMOS transistors MN1 and MN2.

The PMOS transistor MP0 has a gate coupled to the output of the operation amplifier OPAMP0, a source coupled to VDD and a drain coupled to the resistor R1. The PMOS transistor MP1 has a gate coupled to the output of the operation amplifier OPAMP0, a source coupled to VDD and a drain coupled to the drain of the NMOS transistor MN0. The PMOS transistor MP1 provides a bias NBIAS at the drain. The PMOS transistors MP0 and MP1 act as a current mirror.

The NMOS transistor MN0 is diode-connected. The NMOS transistor MN0 has a gate and a drain coupled to the bias voltage NBIAS and a source coupled to ground GND. The NMOS transistors MN0 and MN3 also act as a current mirror.

The NMOS transistor MN1 has a gate coupled to the output VBLR of the operation amplifier OPAMP1, a drain coupled to VDD and a source coupled to the node N2 which is coupled to the input terminal of the operation amplifier OPAMP1.

The NMOS transistor MN2 has a gate coupled to the output of the operation amplifier OPAMP1, a drain coupled to the drain of the PMOS transistor MP2 and a source for providing a bit line voltage RGBL.

The resistors R1, R2, R3 and R4 are series connected between the drain of the PMOS transistor MP0 and ground GND. The resistor R5 is connected between the node N2 and ground GND.

Via the operation amplifier OPAMP0, the node voltage FB of the node N1 is equal to the reference voltage REF (i.e. FB=REF). Thus, the current I1 flows through the resistors R1, R2, R3 and R4 would be I1=(REF/R4). Via voltage division, the voltage BGBUF would be BGBUF=REF*(R2+R3+R4)/R4, which is for example but not limited by 0.88V. The PMOS transistors MP0 and MP1 act as a current mirror, and thus the current I2 flowing into the NMOS transistor MN0 is equal to I2=I1=REF/R4. Thus, the currents I1 and I2 are stable current sources.

Via the operation amplifier OPAMP1, the node voltage of the node N2 is equal to the voltage BGBUF, and thus the output voltage VBLR of the operation amplifier OPAMP1 is about equal to VBLR≈BGBUF+Vth, which is for example 0.88V+Vth (Vth is the threshold of the NMOS transistor MN1). Current flow into the resistor R5 is trimmed to equal to normal cell current (ex: 16 µA). The NMOS transistors MN1 and MN2 act as replica bias. As for the NMOS transistor MN2, the bit line voltage RGBL is the source voltage of the NMOS transistor MN2, and thus the bit line voltage RGBL is equal to the gate voltage (i.e. VBLR) minus the threshold voltage. Therefore, the bit line voltage RGBL is equal to around RGBL≈VBLR−Vth≈(BGBUF+Vth)−Vth≈BGBUF, which is for example 0.88V.

Thus, from the above description, in the embodiment of the application, the regulator 120 provides the bit line voltage RGBL to the selected cell MC of the memory array 110 and provides the bias voltage NBIAS to the control circuit 130.

In the control circuit 130 of the memory device 100, the NMOS transistor MN3 of the control circuit 130 and the NMOS transistor MN0 of the regulator 120 also act as a current mirror. Thus, the current I3 flows through the NMOS transistor MN3 is the same as the current flowing through the NMOS transistor MN0, i.e. I3=I2. In one possible example, the normal current I3 flows into the NMOS transistor MN3 is around 5 µA.

The PMOS transistors MP2 and MP3 act as a current mirror. Also, the current flows through the PMOS transistor MP2 is equal to the current flowing through the PMOS transistor MP3 and the NMOS transistor MN3.

In general, if the memory array 110 has large circuit size (i.e. a lot of word lines, a lot of bit lines and a lot of cells), then during setup procedure, the word line voltage (RWL in FIG. 2), which is a high voltage, will have a slow setup speed. That is to say, when the corresponding cell is selected for reading, transition of the corresponding word line voltage RWL from low logic to high logic will be slow, but transition of the corresponding bit line voltage RGBL from low logic to high logic is fast (because the bit line voltage RGBL is not a high voltage). However, if the bit line voltage RGBL is not maintained, then a read disturbance will be likely to occur due to overshoot of RGBL.

Thus, in the application, when the cell current flowing through the selected cell MC of the memory array 110 is gradually increased, the bit line voltage RGBL is gradually pulled down. Thus, the current I4 is also lowered (thus the node voltage at the node N3 will be gradually pulled up) but the current I3 is substantially fixed. When the cell current of the selected cell MC substantially reaches or is substantially close to the current I3 (the value of the current I3 may be also referred as a threshold), the node voltage at the node N3 will be raised high enough to shut down the PMOS transistor MP4 of the controllable current source 140 (i.e. the PMOS transistor MP4 of the controllable current source 140 will be shut down by the control circuit 130). That is to say, the timing to shut down the PMOS transistor MP4 of the controllable current source 140 may be related to the value of the current I3, i.e. the timing to shut down the PMOS transistor MP4 of the controllable current source 140 may be adjusted by adjusting the bias NBIAS provided to the gate of the NMOS transistor MN3.

In more detail, at initial transition of the corresponding word line voltage RWL from low logic to high logic, the selected cell MC is not turned on yet (because the word line voltage RWL is not high enough) and thus there is no cell current flowing through the selected cell MC. Thus, because the bias voltage NBIAS provided from the regulator 120 turns on the NMOS transistor MN3, the current I3 flowing through the NMOS transistor MN3 and the PMOS transistor MP3 will be mirrored by the PMOS transistor MP2. Therefore, the current I4 flowing through the PMOS transistor MP4 is the same as the current flowing through the PMOS transistor MP2 (i.e. I4=I3) because there is no cell current (i.e. the current flowing through the PMOS transistor MP2 totally flows into the PMOS transistor MP4). By this, the node voltage at the node N3 (i.e. the gate voltage of the PMOS transistor MP4) and the bit line voltage RGBL are maintained.

Then, during the word line voltage RWL is slightly raised and before the selected cell MC is completed turned on, the selected cell is slightly turned on and thus a slight cell current flows through the selected cell MC (i.e. the cell current flowing through the selected cell MC of the memory array 110 is gradually increased). Therefore, the bit line voltage RGBL is gradually lowered. Also, the current flowing through the transistor MP4 (i.e. I4) is also lowered but the current I3 is substantially fixed, and accordingly, the node voltage at the node N3 (which is also the gate voltage of the PMOS transistor MP4) is slightly raised (but the gate voltage of the PMOS transistor MP4 is not enough to turn off the PMOS transistor MP4).

When the cell current of the selected cell MC substantially reaches or is substantially close to the current I3, the node voltage N3 (which is the gate voltage of the PMOS transistor MP4) is high enough to turn off the PMOS transistor MP4. That is to say, the timing to shut down the PMOS transistor MP4 of the controllable current source 140 may be related to the value of the current I3, i.e. the timing to shut down the PMOS transistor MP4 of the controllable current source 140 may be adjusted by adjusting the bias NBIAS provided to the gate of the NMOS transistor MN3. In other words, in the memory device 100, the controllable current source 140 is shut down by the control circuit 130.

Thus, in the embodiment of the application, the transistors MP3, MP4 and MN3 may be used to reduce the overshoot of the bit line voltage RGBL during the word line voltage RWL slowly ramps up via conduction of the current I4 flowing through the PMOS transistor MP4. In other words, because a part of the current flowing through the NMOS transistor MN2 is drawn by the PMOS transistor MP4, overshoot on the bit line voltage RGBL is reduced.

Figure 3A:
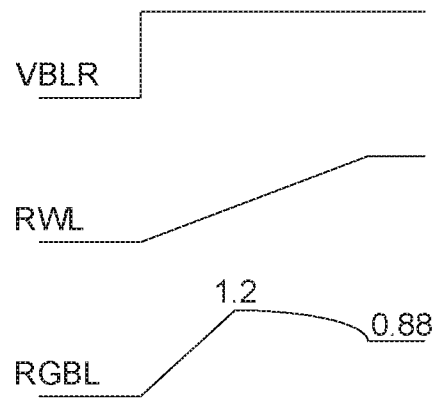
FIGS. 3A and 3B shows overshoot of the bit line voltage without and with applying the embodiment of the application.
Figure 3B:
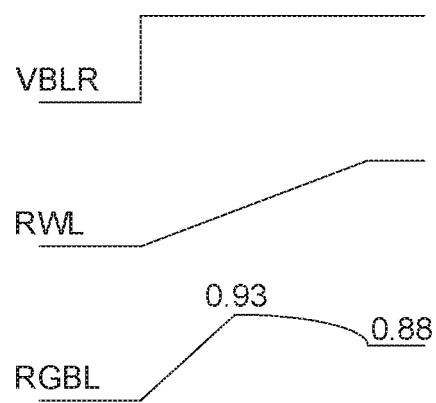

FIGS. 3A and 3B shows overshoot of the bit line voltage RGBL when without and with the transistors MP3, MP4 and MN3, respectively (if the bit line voltage RGBL is around 0.88V). As shown in FIG. 3A and FIG. 3B, when the voltage VBLR is transited from low logic to high logic, the bit line voltage RGBL and the word line voltage RWL are also transited from low logic to high logic, but the bit line voltage RGBL is transited faster than the word line voltage RWL.

As shown in FIG. 3A, without the transistors MP3, MP4 and MN3, the overshoot of the bit line voltage RGBL may be 1.2V during the word line voltage RWL slowly ramps up. On the contrary, as shown in FIG. 3B, with the transistors MP3, MP4 and MN3, the overshoot of the bit line voltage RGBL may be reduced from 1.2V to 0.93V during the word line voltage RWL slowly ramps up.

Thus, in the embodiment of the application, the overshoot of the bit line voltage RGBL during the word line voltage RWL slowly ramps up is reduced via the control circuit 130 and the controllable current source 140. Thus, the read disturbance will be also improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device including:
    a memory array having a plurality of cells,
    a regulator, coupled to the memory, the regulator being configured to provide a bit line voltage to a selected cell of the memory array and to provide a bias voltage, and
    a controllable current source, coupled to the memory array, the controllable current source being configured to conduct a controllable current in the controllable current source until a cell current of the selected cell reaches a threshold and to maintain the bit line voltage of the selected cell of the memory array via conduction of the controllable current in the controllable current source.

2. The memory device according to claim 1, further including:
    a control circuit, coupled to the regulator and the controllable current source, the control circuit being configured to receive the bias voltage from the regulator,
    wherein, the control circuit and the controllable current source are configured to maintain the bit line voltage of the selected cell of the memory array via conduction of the controllable current in the controllable current source.

3. The memory device according to claim 2, wherein the controllable current source is shut down by the control circuit when the cell current of the selected cell reaches the threshold.

4. The memory device according to claim 2, wherein the control circuit includes:
    a first MOS transistor, coupled to the controllable current source, and
    a current mirror coupled to the first MOS transistor and the controllable current source,
    wherein the first MOS transistor receives the bias voltage from the regulator, and the current mirror mirrors the controllable current to generate a first current flowing through the first MOS transistor, the threshold being related to the first current flowing through the first MOS transistor.

5. The memory device according to claim 4, wherein the controllable current source includes:
    a second MOS transistor having a gate coupled to the first MOS transistor, a source coupled to the current mirror and a drain coupled to ground.

6. The memory device according to claim 5, wherein when the cell current of the selected cell does not reach the threshold, the controllable current flowing through the second transistor is determined by the first current, and the bit line voltage of the selected cell is maintained.

7. An operation method for a memory device, the operation method including:
    providing a bit line voltage to a selected cell of the memory device;
    conducting a controllable current to maintain the bit line voltage of the selected cell of the memory array via conduction of the controllable current in a controllable current source; and
    shutting down the controllable current when a cell current of the selected cell reaches a threshold.

8. The operation method according to claim 7, further including:
    providing a bias voltage to a control circuit of the memory device.

* * * * *